United States Patent
Shigeta

(10) Patent No.: US 9,199,443 B2
(45) Date of Patent: Dec. 1, 2015

(54) SINGLE MOTOR-DRIVEN GRAVURE CYLINDER CHUCK MECHANISM

(71) Applicant: THINK LABORATORY CO., LTD., Chiba (JP)

(72) Inventor: Tatsuo Shigeta, Chiba (JP)

(73) Assignee: THINK LABORATORY CO., LTD., Chiba (JP)

( * ) Notice: Subject to any disclaimer, the term of this patent is extended or adjusted under 35 U.S.C. 154(b) by 0 days.

(21) Appl. No.: 14/241,546

(22) PCT Filed: Dec. 5, 2012

(86) PCT No.: PCT/JP2012/081487
§ 371 (c)(1),
(2) Date: Feb. 27, 2014

(87) PCT Pub. No.: WO2013/084927
PCT Pub. Date: Jun. 13, 2013

(65) Prior Publication Data
US 2014/0192383 A1    Jul. 10, 2014

(30) Foreign Application Priority Data
Dec. 7, 2011  (JP) ................. 2011-267525

(51) Int. Cl.
| | | |
|---|---|---|
| *B41C 1/00* | (2006.01) |
| *B41C 1/04* | (2006.01) |
| *B41C 1/18* | (2006.01) |
| *C25D 7/00* | (2006.01) |
| *C25D 17/06* | (2006.01) |
| *G03F 7/24* | (2006.01) |
| *G03F 7/30* | (2006.01) |

(52) U.S. Cl.
CPC ... *B41C 1/04* (2013.01); *B41C 1/18* (2013.01); *C25D 7/00* (2013.01); *C25D 17/06* (2013.01); *G03F 7/24* (2013.01); *G03F 7/3021* (2013.01)

(58) Field of Classification Search
None
See application file for complete search history.

(56) References Cited

U.S. PATENT DOCUMENTS 5,424,846 A   6/1995   Bornhorst et al.
5,492,057 A *  2/1996   Bornhors et al. ............ 358/3.32
(Continued)

FOREIGN PATENT DOCUMENTS

CN   102753348 A   10/2012
DE   69617920 T2    9/2002
(Continued)

Primary Examiner — Mohammad Ghayour
Assistant Examiner — Christopher D Wait
(74) Attorney, Agent, or Firm — McGlew and Tuttle, P.C.

(57) ABSTRACT

Provided is a single-motor-driven gravure cylinder chuck mechanism that is enhanced in contact tightness of chuck cones with respect to an unprocessed plate-making roll in each processing unit of a fully automatic plate-making system. The gravure cylinder chuck mechanism is to be used for a processing unit of the fully automatic gravure plate-making processing system for manufacturing a plate-making roll by performing a series of processes on an unprocessed plate-making roll. The gravure cylinder chuck mechanism includes: a pair of chuck cones provided to be opposed to each other, for chucking both end surfaces of the unprocessed plate-making roll; chuck cone moving means for allowing the pair of chuck cones to be freely brought into contact with and separated away from both the end surfaces of the unprocessed plate-making roll; and a single motor for driving the chuck cone moving means. The single motor allows the pair of chuck cones to be freely brought into contact with and separated away from both the end surfaces of the unprocessed plate-making roll so that the pair of chuck cones chuck the unprocessed plate-making roll.

14 Claims, 3 Drawing Sheets

(56) References Cited

U.S. PATENT DOCUMENTS

| | | | |
|---|---|---|---|
| 5,583,647 A * | 12/1996 | Izor et al. | 358/3.32 |
| 5,661,565 A | 8/1997 | Bornhorst et al. | |
| 5,715,068 A | 2/1998 | Izor et al. | |
| 5,751,435 A | 5/1998 | Bornhorst et al. | |
| 5,854,690 A | 12/1998 | Bornhorst et al. | |
| 6,079,303 A * | 6/2000 | Lyachovitsky | 82/165 |
| 2012/0308347 A1 | 12/2012 | Shigeta | |

FOREIGN PATENT DOCUMENTS

| | | |
|---|---|---|
| DE | 69431202 T2 | 12/2002 |
| EP | 697156 A | 2/1996 |
| EP | 776271 A | 6/1997 |
| EP | 812269 A | 12/1997 |
| JP | 64-12309 A | 1/1989 |
| JP | Hei 10-193551 A | 7/1998 |
| JP | H10-509383 A | 9/1998 |
| JP | Hei 11-61488 A | 3/1999 |
| JP | Hei 11-254276 A | 9/1999 |
| JP | 2002-283532 A | 10/2002 |
| KR | 10-2002-0035773 A | 5/2002 |
| WO | 94/26060 A1 | 11/1994 |
| WO | 96/05966 A1 | 2/1996 |
| WO | 96/26843 A1 | 9/1996 |
| WO | 2007/135898 A1 | 11/2007 |
| WO | 2007/135899 A1 | 11/2007 |
| WO | 2011/125926 A1 | 10/2011 |

* cited by examiner

SINGLE MOTOR-DRIVEN GRAVURE CYLINDER CHUCK MECHANISM

TECHNICAL FIELD

The present invention relates to a single-motor-driven gravure cylinder chuck mechanism to be used for processing units of a fully automatic gravure plate-making processing system.

BACKGROUND ART

Conventionally, fully automatic gravure plate-making processing systems disclosed in, for example, Patent Documents 1 to 3 have been known.

Further, the applicant of this application has proposed a fully automatic gravure plate-making processing system having high degrees of freedom, which is capable of manufacturing a gravure plate-making roll more quickly as compared to a conventional system, achieving space saving, performing an unattended operation even in the nighttime, flexibly customizing a manufacturing line, and satisfying various customer needs (Patent Document 4).

The above-mentioned fully automatic gravure plate-making processing system is configured to manufacture a plate-making roll by performing a series of processes on a plate-making roll to be processed (hereinafter referred to as "unprocessed plate-making roll"), and the processes are performed by respective processing units.

Processing units described in, for example, Patent Document 5 or 6 are known as the conventional processing units. Those conventional processing units include motors provided to respective chuck cones for chucking both sides of the unprocessed plate-making roll, and move the chuck cones so as to chuck the unprocessed plate-making roll.

In such a chuck mechanism including the motors provided on both sides, however, the chuck cones individually chuck the unprocessed plate-making roll, and hence there is a problem of low contact tightness of the chuck cones with respect to the unprocessed plate-making roll.

In particular, when the contact tightness of the chuck cones is low in a plating apparatus, there is a problem of a plating defect.

PRIOR ART DOCUMENTS

Patent Documents

Patent Document 1: JP Hei 10-193551 A
Patent Document 2: WO 2007/135898
Patent Document 3: WO 2007/135899
Patent Document 4: WO 2011/125926
Patent Document 5: JP Hei 11-61488 A
Patent Document 6: JP Hei 11-254276 A

SUMMARY OF THE INVENTION

Problems to be Solved by the Invention

The present invention has been made in view of the above-mentioned problems inherent in the conventional technologies, and it is therefore an object thereof to provide a single-motor-driven gravure cylinder chuck mechanism that is enhanced in contact tightness of chuck cones with respect to an unprocessed plate-making roll in each processing unit of a fully automatic plate-making system.

Means for Solving Problems

In order to solve the above-mentioned problems, according to one embodiment of the present invention, there is provided a single-motor-driven gravure cylinder chuck mechanism to be used for a processing unit of a fully automatic gravure plate-making processing system for manufacturing a plate-making roll by performing a series of processes on an unprocessed plate-making roll, the single-motor-driven gravure cylinder chuck mechanism including: a pair of chuck cones provided to be opposed to each other, for chucking both end surfaces of the unprocessed plate-making roll; chuck cone moving means for allowing the pair of chuck cones to be freely brought into contact with and separated away from both the end surfaces of the unprocessed plate-making roll; and a single motor for driving the chuck cone moving means, the single motor allowing the pair of chuck cones to be freely brought into contact with and separated away from both the end surfaces of the unprocessed plate-making roll so that the pair of chuck cones chuck the unprocessed plate-making roll.

The single motor allows the pair of chuck cones to be freely brought into contact with and separated away from both the end surfaces of the unprocessed plate-making roll in synchronization with each other, and hence there is an advantage of enhancing the contact tightness of the chuck cones with respect to the unprocessed plate-making roll. As the single motor, a servo motor is preferred, and any of an AC servo motor and a DC servo motor is applicable.

The single motor is used, and hence the pressing of the unprocessed plate-making roll by the chuck cones can be managed accurately, with the result that the contact tightness of the chuck cones with respect to the unprocessed plate-making roll is enhanced.

It is preferred that the chuck cone moving means include: a pair of ball screws provided to be opposed to each other and constructed by threadedly engaging ball screw nuts with screw shafts, respectively; and chuck cone gripping members mounted to the ball screw nuts, for gripping rear end portions of the pair of chuck cones, respectively.

Further, it is preferred that the chuck cone moving means further include an elongated rod member to be rotated by the single motor, and that the pair of ball screws be engaged with the elongated rod member so that the pair of chuck cones are allowed to be freely brought into contact with and separated away from both the end surfaces of the unprocessed plate-making roll, respectively.

It is preferred that the single motor include a motor control circuit capable of switching positional control and torque control, that the positional control and the torque control be performed on the chuck cone moving means, that the positional control be performed until the pair of chuck cones reach predetermined positions with respect to both the end surfaces of the unprocessed plate-making roll, and that, when the pair of chuck cones are brought closer to both the end surfaces of the unprocessed plate-making roll to start pressing both the end surfaces, respectively, the torque control be performed until a torque reaches a predetermined torque.

As the single motor, there may be used a motor including a publicly-known motor control circuit capable of switching the positional control and the torque control through feedback loop switching. Further, through the positional control using such a single motor, the positional adjustment can be performed in units of 1 μm, and the torque can be adjusted freely in a range of from zero to several hundreds of kilograms. Thus, when the pair of chuck cones press both the end surfaces of the unprocessed plate-making roll, the pressing force can be controlled accurately.

Further, electric power control is also performed, and hence the electric energy can also be adjusted freely in a range of, for example, from 2,000 W to 3,000 W.

Further, it is preferred that the processing unit include at least one processing apparatus selected from among a copper plating apparatus, a photosensitive film coating apparatus, an electronic engraving apparatus, a laser exposure apparatus, a degreasing apparatus, a grinding wheel polishing apparatus, an ultrasonic cleaning apparatus, a surface hardening film forming apparatus, a developing apparatus, an etching apparatus, a resist image removal apparatus, or a paper polishing apparatus.

Advantageous Effects of the Invention

The present invention has a remarkable effect of providing the single-motor-driven gravure cylinder chuck mechanism that is enhanced in contact tightness of the chuck cones with respect to the unprocessed plate-making roll in each processing unit of the fully automatic plate-making system.

MODES FOR CARRYING OUT THE INVENTION

Embodiments of the present invention are described below, but those embodiments are described as examples, and hence it is understood that various modifications may be made thereto without departing from the technical spirit of the present invention. In addition, the same members are represented by the same reference symbols.

Figure 1:
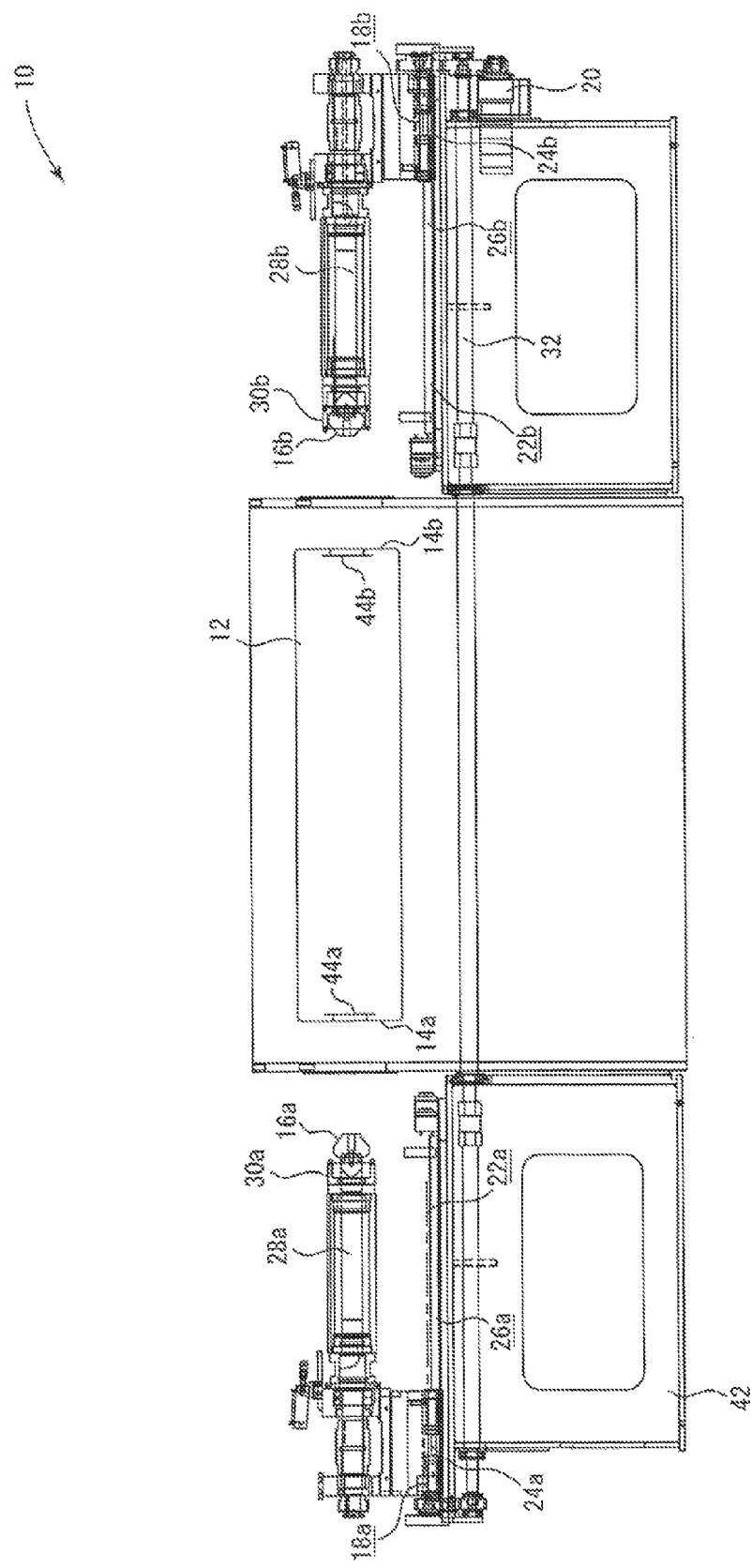
FIG. 1 is a front view illustrating a single-motor-driven gravure cylinder chuck mechanism according to one embodiment of the present invention.
Figure 2:
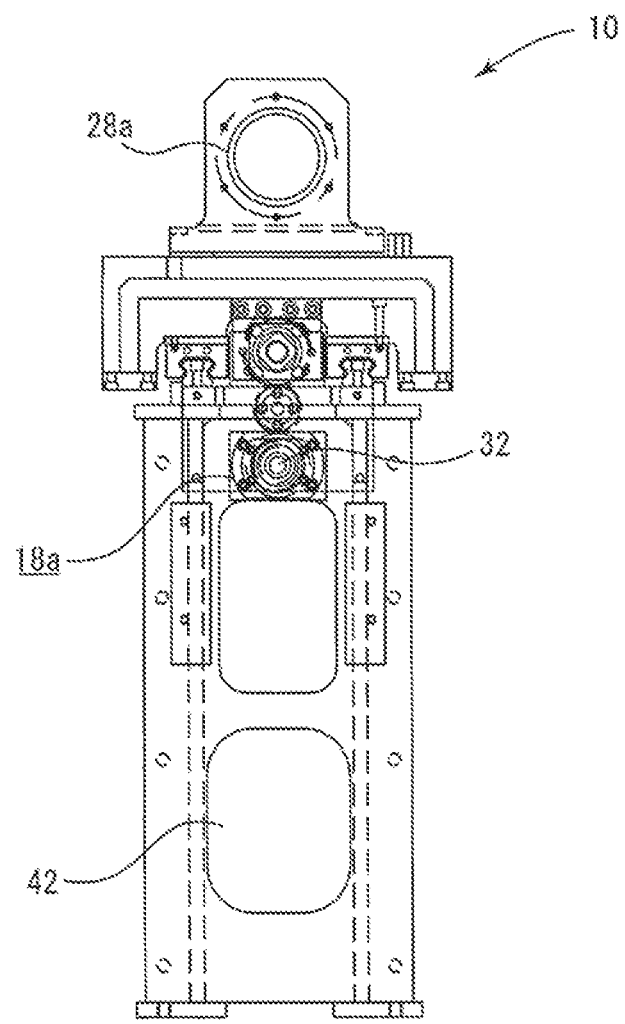
FIG. 2 is a left-hand side view of chuck cone moving means 18a in FIG. 1.
Figure 3:
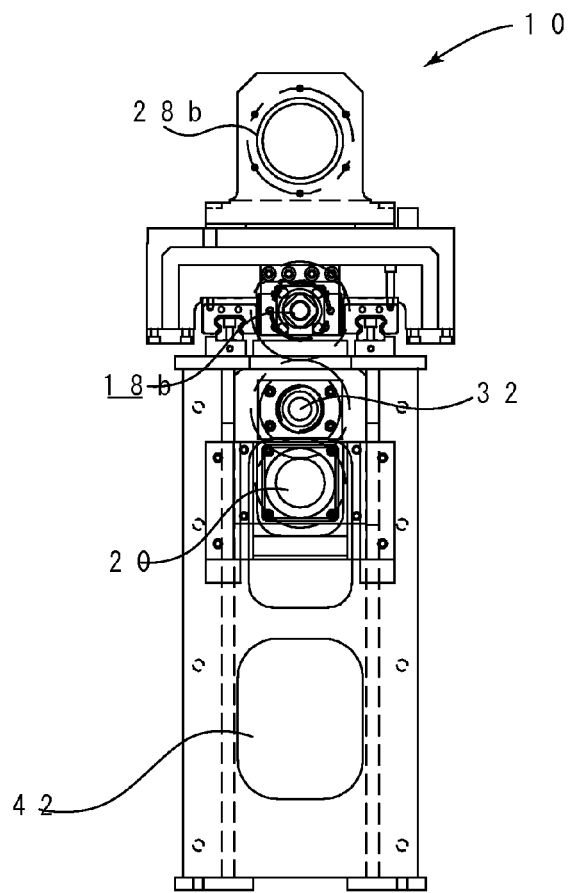
FIG. 3 is a right-hand side view of chuck cone moving means 18b in FIG. 1.

In FIGS. 1 to 3, reference symbol 10 represents a single-motor-driven gravure cylinder chuck mechanism of the present invention.

The single-motor-driven gravure cylinder chuck mechanism 10 is a gravure cylinder chuck mechanism to be used for a processing unit of a fully automatic gravure plate-making processing system for manufacturing a plate-making roll by performing a series of processes on an unprocessed plate-making roll 12. The single-motor-driven gravure cylinder chuck mechanism 10 includes a pair of chuck cones 16a and 16b provided to be opposed to each other, for chucking both end surfaces 14a and 14b of the unprocessed plate-making roll 12, chuck cone moving means 18a and 18b for allowing the pair of chuck cones 16a and 16b to be freely brought into contact with and separated away from both the end surfaces 14a and 14b of the unprocessed plate-making roll 12, and a single motor 20 (in the example of the figures, an AC servo motor) for driving the chuck cone moving means 18a and 18b.

Further, the single motor 20 allows the pair of chuck cones 16a and 16b to be freely brought into contact with and separated away from both the end surfaces 14a and 14b of the unprocessed plate-making roll 12 so that the pair of chuck cones 16a and 16b chuck the unprocessed plate-making roll 12. Note that, in the figures, reference symbol 42 represents a pedestal member of the single-motor-driven gravure cylinder chuck mechanism 10. Note that, reference symbols 44a and 44b represent inner holes of the unprocessed plate-making roll 12, and the pair of chuck cones 16a and 16b are fitted to the inner holes 44a and 44b, respectively.

In the example of the figures, the chuck cone moving means 18a and 18b include a pair of ball screws 26a and 26b provided to be opposed to each other and constructed by threadedly engaging ball screw nuts 24a and 24b with screw shafts 22a and 22b, and chuck cone gripping members 28a and 28b mounted to the ball screw nuts 24a and 24b, for gripping rear end portions of the chuck cones 16a and 16b, respectively. Note that, when the single-motor-driven gravure cylinder chuck mechanism 10 is mounted to a processing unit such as a plating apparatus, waterproof packings 30a and 30b are used as necessary to cover the chuck cones 16a and 16b, respectively.

Further, in the example of the figures, the chuck cone moving means 18a and 18b further include an elongated rod member 32 to be rotated by the single motor 20. The pair of ball screws 26a and 26b are engaged with the elongated rod member 32 so that the pair of chuck cones 16a and 16b are allowed to be freely brought into contact with and separated away from both the end surfaces 14a and 14b of the unprocessed plate-making roll 12, respectively. In this manner, the single motor 20 allows the pair of chuck cones 16a and 16b to be freely brought into contact with and separated away from both the end surfaces 14a and 14b of the unprocessed plate-making roll 12 in synchronization with each other.

Further, the single motor 20 includes a motor control circuit capable of switching positional control and torque control. Thus, the positional control and the torque control are performed on the chuck cone moving means 18a and 18b. A controlled positioning method is described next.

First, the positional control is performed until the pair of chuck cones 16a and 16b reach predetermined positions with respect to both the end surfaces 14a and 14b of the unprocessed plate-making roll 12 (for example, 10 cm from both the end surfaces 14a and 14b), and the pair of chuck cones 16a and 16b stand by at the predetermined positions, respectively.

Figure 4:
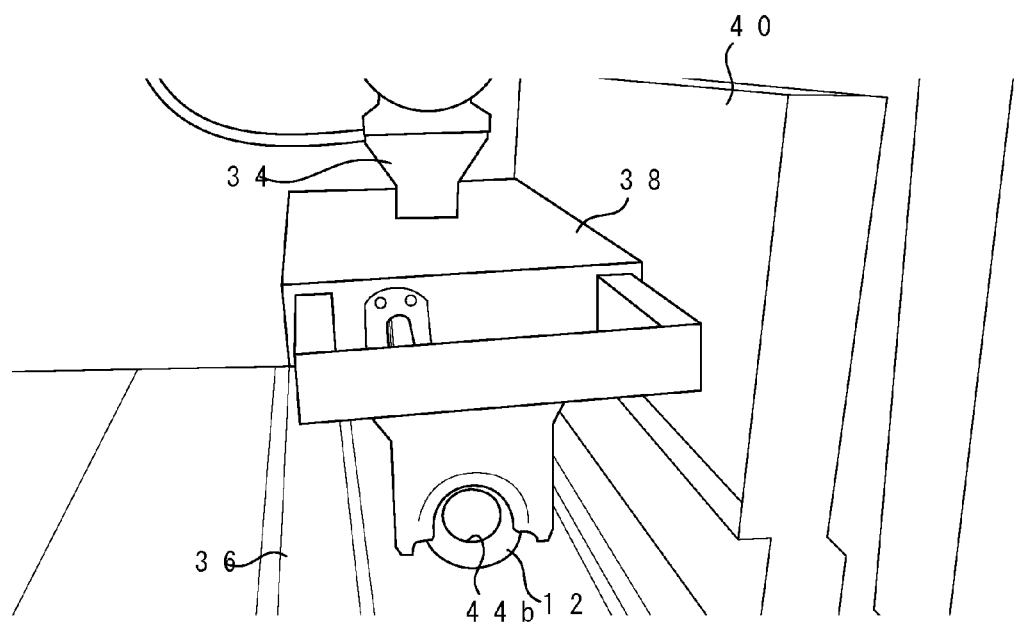
FIG. 4 is an enlarged perspective view of a main part, for illustrating a situation where an unprocessed plate-making roll is transferred to a processing unit.

Subsequently, when the unprocessed plate-making roll 12 transported by an industrial robot 34 (or a stacker crane) is inserted into a processing unit 36 (in the example of the figure, a copper plating apparatus) as illustrated in FIG. 4, the pair of chuck cones 16a and 16b illustrated in FIG. 1 are brought closer to both the end surfaces 14a and 14b of the unprocessed plate-making roll 12 to start pressing both the end surfaces 14a and 14b, respectively. Then, the torque control is performed until the torque reaches a predetermined torque (for example, set to 150 kg to 1,000 kg in accordance with the mass of the cylinder that is the unprocessed plate-making roll 12).

Note that, in FIG. 4, reference symbol 38 represents a gripping member provided at a distal end of a robotic arm of the industrial robot 34, for gripping the unprocessed plate-making roll 12. The gripping member 38 is freely widened and narrowed in accordance with the size of the unprocessed plate-making roll 12. Further, reference symbol 40 represents a hood member that is closed during work of processing the unprocessed plate-making roll 12.

Further, as the processing unit 36, there may be applied at least one processing apparatus selected from among a copper plating apparatus, a photosensitive film coating apparatus, an electronic engraving apparatus, a laser exposure apparatus, a degreasing apparatus, a grinding wheel polishing apparatus, an ultrasonic cleaning apparatus, a surface hardening film forming apparatus, a developing apparatus, an etching apparatus, a resist image removal apparatus, or a paper polishing apparatus. In the example of the figure, the copper plating apparatus is taken as an example of the processing unit 36.

As the surface hardening film forming apparatus, a chromium plating apparatus, a diamond-like carbon (DLC) film forming apparatus, a silicon dioxide film forming apparatus using a perhydropolysilazane solution, or the like may be used. As the chromium plating apparatus, for example, an apparatus described in Patent Document 1 may be used. As the diamond-like carbon (DLC) film forming apparatus, for example, an apparatus described in Patent Document 2 may be used. As the silicon dioxide film forming apparatus using a perhydropolysilazane solution, for example, an apparatus described in Patent Document 3 may be used.

As described above, through use of the single-motor-driven gravure cylinder chuck mechanism 10, it is possible to enhance the contact tightness of the chuck cones with respect to the unprocessed plate-making roll in each processing unit of the fully automatic plate-making system.

Reference Signs List

10: single-motor-driven gravure cylinder chuck mechanism, 12: unprocessed plate-making roll, 14*a*, 14*b*: both end surfaces, 16*a*, 16*b*: chuck cone, 18*a*, 18*b*: chuck cone moving means, 20: single motor, 22*a*, 22*b*: screw shaft, 24*a*, 24*b*: ball screw nut, 26*a*, 26*b*: ball screw, 28*a*, 28*b*: chuck cone gripping member, 30*a*, 30*b*: waterproof packing, 32: elongated rod member, 34: industrial robot, 36: processing unit, 38: gripping member, 40: hood member, 42: pedestal member, 44*a*, 44*b*: inner hole.

The invention claimed is:

1. A single-motor-driven gravure cylinder chuck mechanism to be used for a processing unit of a fully automatic gravure plate-making processing system for manufacturing a plate-making roll by performing a series of processes on an unprocessed plate-making roll, the single-motor-driven gravure cylinder chuck mechanism comprising:
    a pair of chuck cones provided to be opposed to each other, for chucking both end surfaces of the unprocessed plate-making roll;
    a chuck cone moving means for allowing the pair of chuck cones to be freely brought into contact with and separated away from both the end surfaces of the unprocessed plate-making roll, said chuck cone moving means comprising a pair of ball screws, one of said ball screws being located opposite another one of said ball screws, each of said ball screws comprising a threadedly engaging ball screw nut with a screw shaft, said chuck cone moving means further comprising an elongated rod member, said pair of ball screws engaging the elongated rod member such that the pair of chuck cones are allowed to be freely brought into contact with and separated away from both the end surfaces of the unprocessed plate-making roll, respectively; and
    a single motor for driving the chuck cone moving means, the single motor allowing the pair of chuck cones to be freely brought into contact with and separated away from both the end surfaces of the unprocessed plate-making roll so that the pair of chuck cones chuck the unprocessed plate-making roll, said elongated rod member being connected to said single motor, wherein said elongated rod is rotatable via said single motor.

2. A single-motor-driven gravure cylinder chuck mechanism according to claim 1, wherein the chuck cone moving means comprises chuck cone gripping members mounted to the ball screw nuts, for gripping rear end portions of the pair of chuck cones, respectively.

3. A single-motor-driven gravure cylinder chuck mechanism according to claim 1, wherein:
    the single motor comprises a motor control circuit capable of switching positional control and torque control;
    the positional control and the torque control are performed on the chuck cone moving means;
    the positional control is performed until the pair of chuck cones reach predetermined positions with respect to both the end surfaces of the unprocessed plate-making roll; and
    when the pair of chuck cones are brought closer to both the end surfaces of the unprocessed plate-making roll to start pressing both the end surfaces, respectively, the torque control is performed until a torque reaches a predetermined torque.

4. A single-motor-driven gravure cylinder chuck mechanism according to claim 1, wherein the processing unit comprises at least one processing apparatus, said at least one processing apparatus comprising one of a copper plating apparatus, a photosensitive film coating apparatus, an electronic engraving apparatus, a laser exposure apparatus, a degreasing apparatus, a grinding wheel polishing apparatus, an ultrasonic cleaning apparatus, a surface hardening film forming apparatus, a developing apparatus, an etching apparatus, a resist image removal apparatus and a paper polishing apparatus.

5. A single-motor-driven gravure cylinder chuck mechanism according to claim 2, wherein:
    the single motor comprises a motor control circuit capable of switching positional control and torque control;
    the positional control and the torque control are performed on the chuck cone moving means;
    the positional control is performed until the pair of chuck cones reach predetermined positions with respect to both the end surfaces of the unprocessed plate-making roll; and
    when the pair of chuck cones are brought closer to both the end surfaces of the unprocessed plate-making roll to start pressing both the end surfaces, respectively, the torque control is performed until a torque reaches a predetermined torque.

6. A single-motor-driven gravure cylinder chuck mechanism according to claim 1, wherein:
    the single motor comprises a motor control circuit capable of switching positional control and torque control;
    the positional control and the torque control are performed on the chuck cone moving means;
    the positional control is performed until the pair of chuck cones reach predetermined positions with respect to both the end surfaces of the unprocessed plate-making roll; and
    when the pair of chuck cones are brought closer to both the end surfaces of the unprocessed plate-making roll to start pressing both the end surfaces, respectively, the torque control is performed until a torque reaches a predetermined torque.

7. A single-motor-driven gravure cylinder chuck mechanism according to claim 2, wherein the processing unit comprises at least one processing apparatus, said at least one processing apparatus comprising one of a copper plating apparatus, a photosensitive film coating apparatus, an electronic engraving apparatus, a laser exposure apparatus, a degreasing apparatus, a grinding wheel polishing apparatus, an ultrasonic cleaning apparatus, a surface hardening film forming apparatus, a developing apparatus, an etching apparatus, a resist image removal apparatus and a paper polishing apparatus.

8. A single-motor-driven gravure cylinder chuck mechanism according to claim 3, wherein the processing unit comprises at least one processing apparatus, said at least one processing apparatus comprising one of a copper plating apparatus, a photosensitive film coating apparatus, an electronic engraving apparatus, a laser exposure apparatus, a degreasing apparatus, a grinding wheel polishing apparatus, an ultrasonic cleaning apparatus, a surface hardening film forming apparatus, a developing apparatus, an etching apparatus, a resist image removal apparatus and a paper polishing apparatus.

9. A single-motor-driven gravure cylinder chuck mechanism according to claim 1, wherein one portion of said elongated rod is in direct contact with one of said ball screws and another portion of said elongated rod is in direct contact with another one of said ball screws.

10. A single-motor-driven gravure cylinder chuck mechanism according to claim 9, wherein said pair of ball screws are driven exclusively by said elongated rod and said single motor.

11. A single-motor-driven gravure cylinder chuck mechanism to be used for a processing unit of a fully automatic gravure plate-making processing system for manufacturing a plate-making roll by performing a series of processes on an unprocessed plate-making roll, the single-motor-driven gravure cylinder chuck mechanism comprising:
- a pair of chuck cones provided to be opposed to each other, for chucking both end surfaces of the unprocessed plate-making roll;
- a chuck cone moving means for allowing the pair of chuck cones to be freely brought into contact with and separated away from both the end surfaces of the unprocessed plate-making roll, said chuck cone moving means comprising a pair of ball screws, one of said ball screws being located opposite another one of said ball screws, each of said ball screws comprising a threadedly engaging ball screw nut with a screw shaft, said chuck cone moving means further comprising an elongated rod member, said pair of ball screws engaging the elongated rod member such that the pair of chuck cones are allowed to be freely brought into contact with and separated away from both the end surfaces of the unprocessed plate-making roll, respectively; and
- a single motor for driving the chuck cone moving means, the single motor allowing the pair of chuck cones to be freely brought into contact with and separated away from both the end surfaces of the unprocessed plate-making roll so that the pair of chuck cones chuck the unprocessed plate-making roll, said elongated rod member being driven exclusively by said single motor, wherein said elongated rod is rotatable exclusively via said single motor.

12. A single-motor-driven gravure cylinder chuck mechanism to be used for a processing unit of a fully automatic gravure plate-making processing system for manufacturing a plate-making roll by performing a series of processes on an unprocessed plate-making roll, the single-motor-driven gravure cylinder chuck mechanism comprising:
- a pair of chuck cones provided to be opposed to each other, for chucking both end surfaces of the unprocessed plate-making roll;
- a chuck cone moving means for allowing the pair of chuck cones to be freely brought into contact with and separated away from both the end surfaces of the unprocessed plate-making roll, said chuck cone moving means comprising a pair of ball screws, one of said ball screws being located opposite another one of said ball screws, said chuck cone moving means further comprising an elongated rod member, each of said pair of ball screws being in direct contact with the elongated rod member; and
- a single motor for driving the chuck cone moving means, the single motor allowing the pair of chuck cones to be freely brought into contact with and separated away from both the end surfaces of the unprocessed plate-making roll so that the pair of chuck cones chuck the unprocessed plate-making roll, said elongated rod member being connected to said single motor, wherein said elongated rod is rotatable exclusively via said single motor.

13. A single-motor-driven gravure cylinder chuck mechanism according to claim 12, wherein each of said ball screws comprises a threadedly engaging ball screw nut with a screw shaft, the pair of chuck cones being allowed to be freely brought into contact with and separated away from both the end surfaces of the unprocessed plate-making roll, respectively, exclusively via said elongated rod member and said single motor.

14. A single-motor-driven gravure cylinder chuck mechanism according to claim 12, wherein said pair of ball screws are driven exclusively by said elongated rod and said single motor.

* * * * *